United States Patent
Hu et al.

(10) Patent No.: US 10,256,098 B2
(45) Date of Patent: Apr. 9, 2019

(54) INTEGRATED ASSEMBLIES CONTAINING GERMANIUM

(71) Applicant: Micron Technology, Inc., Boise, ID (US)

(72) Inventors: Yushi Hu, Boise, ID (US); Shu Qin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 160 days.

(21) Appl. No.: 14/927,217

(22) Filed: Oct. 29, 2015

(65) Prior Publication Data

US 2017/0125426 A1    May 4, 2017

(51) Int. Cl.
| | |
|---|---|
| *H01L 21/28* | (2006.01) |
| *H01L 21/225* | (2006.01) |
| *H01L 27/11556* | (2017.01) |
| *H01L 27/11582* | (2017.01) |

(52) U.S. Cl.
CPC .......... *H01L 21/2253* (2013.01); *H01L 21/28* (2013.01); *H01L 21/28273* (2013.01); *H01L 21/28282* (2013.01); *H01L 27/11556* (2013.01); *H01L 27/11582* (2013.01)

(58) Field of Classification Search
CPC .......... H01L 27/1158; H01L 27/11556; H01L 27/11551; H01L 27/1153; H01L 27/11578; H01L 27/11528; H01L 29/7889; H01L 29/7926; H01L 21/2251; H01L 21/2252; H01L 21/2253
See application file for complete search history.

(56) References Cited

U.S. PATENT DOCUMENTS

| | | | | |
|---|---|---|---|---|
| 4,619,033 A | * | 10/1986 | Jastrzebski | H01L 21/76294 257/E21.131 |
| 5,920,121 A | * | 7/1999 | Forbes | H01L 23/53242 257/522 |
| 6,157,060 A | * | 12/2000 | Kerber | H01L 27/11556 257/315 |
| 2003/0227036 A1 | * | 12/2003 | Sugiyama | H01L 21/845 257/288 |
| 2005/0054175 A1 | * | 3/2005 | Bauer | H01L 21/02381 438/404 |
| 2005/0215071 A1 | * | 9/2005 | Moriceau | H01L 21/02164 438/770 |

(Continued)

*Primary Examiner* — Allen L Parker
*Assistant Examiner* — Gustavo G Ramallo
(74) *Attorney, Agent, or Firm* — Wells St. John P.S.

(57) ABSTRACT

Some embodiments include an integrated assembly having a first semiconductor structure containing heavily-doped silicon, a germanium-containing interface material over the first semiconductor structure, and a second semiconductor structure over the germanium-containing interface material. The second semiconductor structure has a heavily-doped lower region adjacent the germanium-containing interface material and has a lightly-doped upper region above the heavily-doped lower region. The lightly-doped upper region and heavily-doped lower region are majority doped to a same dopant type, and join to one another along a boundary region. Some embodiments include an integrated assembly having germanium oxide between a first silicon-containing structure and a second silicon-containing structure. Some embodiments include methods of forming assemblies.

14 Claims, 10 Drawing Sheets

(56) References Cited

U.S. PATENT DOCUMENTS

| | | | |
|---|---|---|---|
| 2006/0169404 A1* | 8/2006 | Thebault | C04B 35/573 156/307.3 |
| 2006/0289900 A1* | 12/2006 | Thirupapuliyur | H01L 21/823807 257/254 |
| 2008/0112226 A1* | 5/2008 | Mokhlesi | G11C 11/5628 365/185.17 |
| 2008/0149996 A1* | 6/2008 | Mokhlesi | H01L 21/84 257/319 |
| 2009/0291397 A1* | 11/2009 | deVilliers | G03F 7/40 430/319 |
| 2010/0140642 A1* | 6/2010 | Arai | C09K 11/661 257/98 |
| 2012/0031476 A1* | 2/2012 | Bedell | H01L 31/03765 136/255 |

* cited by examiner

INTEGRATED ASSEMBLIES CONTAINING GERMANIUM

TECHNICAL FIELD

Integrated assemblies and methods of forming assemblies.

BACKGROUND

Integrated circuit fabrication may involve formation of a lightly-doped semiconductor material over a heavily-doped semiconductor material, followed by out-diffusion of dopant from the heavily-doped semiconductor material into the lightly-doped semiconductor material. Difficulties may be encountered if the heavily-doped semiconductor material is exposed to oxidative conditions prior to formation of the lightly-doped semiconductor material. For instance, dopant of the heavily-doped semiconductor material may oxidize to reduce an effective concentration of dopant and/or to form a barrier which impedes out-diffusion. Additionally, or alternatively, the semiconductor material may oxidize to form a barrier which impedes out-diffusion.

It would be desirable to develop new methods and structures which alleviate or prevent the above-discussed difficulties.

DETAILED DESCRIPTION OF THE ILLUSTRATED EMBODIMENTS

Some embodiments include a protective material formed over a heavily-doped semiconductor material to alleviate oxidation of such heavily-doped semiconductor material. Lightly-doped semiconductor material may be formed over the protective material, and subsequently dopant may be out-diffused from the heavily-doped semiconductor material, through the protective material, and into the lightly-doped semiconductor material. Alternatively, the protective material may be removed prior to forming the lightly-doped semiconductor material, and subsequently dopant may be out-diffused from the heavily-doped semiconductor material into the lightly-doped semiconductor material. Alternatively, the protective material may be modified prior to forming the lightly-doped semiconductor material, and out-diffused dopant may pass through the modified protective material and into the lightly-doped semiconductor material. For instance, the protective material may initially comprise germanium, which is subsequently oxidized to form germanium oxide; and out-diffused dopant may pass through the germanium oxide.

In some embodiments, the terms "heavily-doped" and "lightly-doped" are utilized in relation to one another rather than relative to specific conventional meanings. Accordingly, a "heavily-doped" region is more heavily doped than an adjacent "lightly-doped" region, and may or may not comprise heavy doping in a conventional sense. Similarly, the "lightly-doped" region is less heavily doped than the adjacent "heavily-doped" region, and may or may not comprise light doping in a conventional sense.

Example embodiments are described with reference to FIGS. 1-12.

Figure 1:
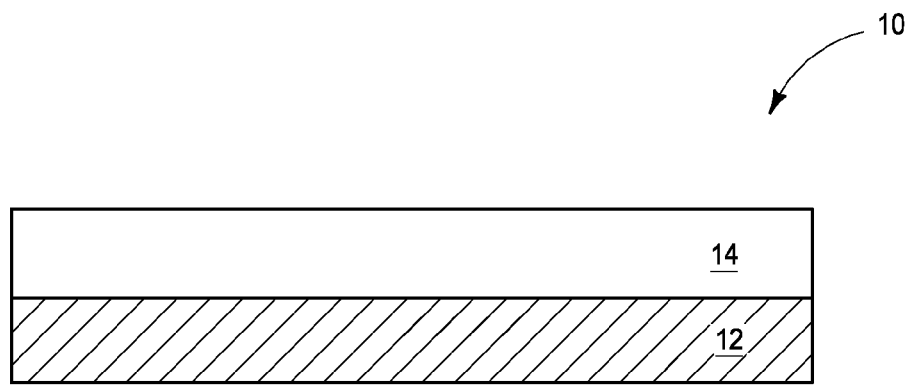
FIGS. 1-9 are diagrammatic cross-sectional views of a construction at various process stages of an example method for forming an example embodiment integrated assembly.

Referring to FIG. 1, a construction 10 comprises a semiconductor material 14 over a conductive material 12. In some embodiments the conductive material 12 may be omitted; for instance, if layer 14 is sufficiently conductive the conductive material 12 may be omitted.

The conductive material 12 may comprise any suitable composition or combination of compositions; and in some embodiments may comprise metal (for instance, tungsten, tantalum, etc.) and/or a metal-containing composition (for instance, metal silicide, metal carbide, etc.). In some example embodiments, conductive material 12 may comprise, consist essentially of, or consist of tungsten silicide.

The semiconductor material 14 may comprise any suitable semiconductor material (for example, silicon, germanium, etc.); and in some embodiments the semiconductor material may comprise, consist essentially of, or consist of silicon. Such semiconductor material may be conductively-doped at the processing stage of FIG. 1 in some embodiments. In other embodiments the semiconductor material may be lightly-doped at the processing stage of FIG. 1, and conductivity-enhancing dopant may be diffused throughout the semiconductor material 14 at a subsequent processing stage (for instance, the processing stage described below with reference to FIG. 9 or the processing stage described below with reference to FIG. 12). The semiconductor material 14 may be referred to as a first semiconductor material to distinguish it from other semiconductor materials which are formed subsequently in example processing described herein.

The conductive material 12 may be over an insulative material (not shown) which in turn is supported by a semiconductor base (not shown). The base may, for example, comprise, consist essentially of, or consist of monocrystalline silicon; and/or or may comprise integrated circuitry. The base may include semiconductor devices (e.g., CMOS). For instance, in some embodiments vertical NAND may be formed over material 14 (as shown and described below with reference to FIGS. 4-12), and the base may comprise CMOS under the NAND memory cells. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, semiconductor substrates.

Figure 2:
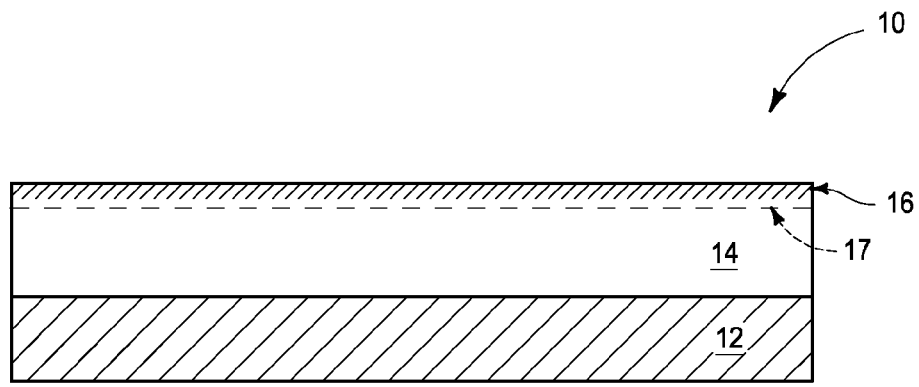

Referring to FIG. 2, a heavily-doped region 16 is formed along a surface of semiconductor material 14. A dashed line 17 is provided to diagrammatically illustrate an approximate lower boundary of the heavily-doped region. The heavily-doped region may have a dopant concentration of greater than or equal to about $10^{19}$ atoms/cm$^3$, in some embodiments may have a dopant concentration of greater than or equal to about $10^{21}$ atoms/cm$^3$, and in some embodiments may have a dopant concentration of greater than or equal to about $10^{22}$ atoms/cm$^3$.

The heavily-doped region 16 is primarily along the surface of semiconductor material 14, which is advantageous in that the heavily-doped region will be subsequently utilized for out-diffusion of dopant into another semiconductor material provided above the heavily-doped region (as described below with reference to FIGS. 9 and 12). In some embodiments the heavily-doped region may extend no deeper than about 10 nanometers (nm) into semiconductor material 14, no deeper than about 5 nm into the semiconductor material, no deeper than about 1 nm into the semiconductor material, no deeper than about 0.5 nm into the semiconductor material, no deeper than about 0.1 nm into the semiconductor material, etc.

The heavily-doped region 16 may be formed with any suitable processing. In some embodiments, it is recognized that it may be advantageous to form heavily-doped region 16 with plasma doping (PLAD); which may also be referred to as plasma immersion ion implantation (PIII). PLAD may advantageously form dopant primarily along an upper surface of semiconductor material 14, as compared to other methods (for instance, beamline ion implantation), which are more likely to spread the dopant deeper into the semiconductor material. Also, PLAD may offer advantages relative to beamline ion implantation such as system simplicity, lower-cost and higher throughput. Any suitable PLAD system may be utilized. An example PLAD system utilizes an RF-excited continuous plasma with a DC pulsed bias substrate The dopant utilized in heavily-doped region 16 may be n-type (for instance, phosphorus) in some embodiments, or p-type (for instance, boron) in other embodiments.

Figure 3:
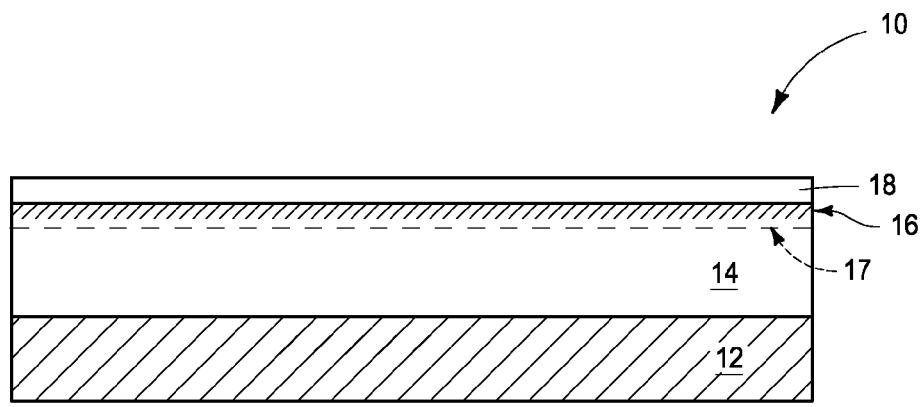

A difficulty which may occur in having heavily-doped region 16 primarily along the surface of semiconductor material 14 is that the heavily-doped region may be susceptible to oxidation if material 14 is exposed to oxidant. The oxidation may consume dopant (for instance, phosphorus may be converted to an oxidized form) and/or may form a barrier across the upper surface of material 14 which impedes subsequent out-diffusion of dopant from the heavily-doped region 16 into a material provided over region 16. Accordingly, a protective material 18 is formed over the heavily-doped region 16, as shown in FIG. 3.

The protective material 18 may be formed with any suitable processing, and is formed under conditions such that the protective material is formed without oxidation (or at least without appreciable oxidation) of the upper surface of heavily-doped region 16. Accordingly, the protective material 18 may be formed in a same chamber as is utilized for forming heavily-doped region 16, may be formed in a separate chamber relative to that utilized for forming heavily-doped region 16 without breaking vacuum, etc.

In some embodiments, heavily-doped region 16 is formed by a PLAD process, and protective material 18 is formed in the same process chamber utilizing a subsequent PLAD process. In some embodiments the heavily-doped region 16 may be considered to be formed by deposition of dopant in a PLAD process, and the protective material 18 may be considered to be formed by deposition of protective material in a continuation of the PLAD process.

The protective material 18 may comprise any suitable composition or combination of compositions. In some embodiments, the protective material 18 may comprise, consist essentially of, or consist of semiconductor material; such as, for example, one or both of silicon and germanium. The protective material 18 may comprise any suitable thickness, such as, for example, a thickness within a range of from about 50 angstroms to about 1 nanometer.

Figure 4:
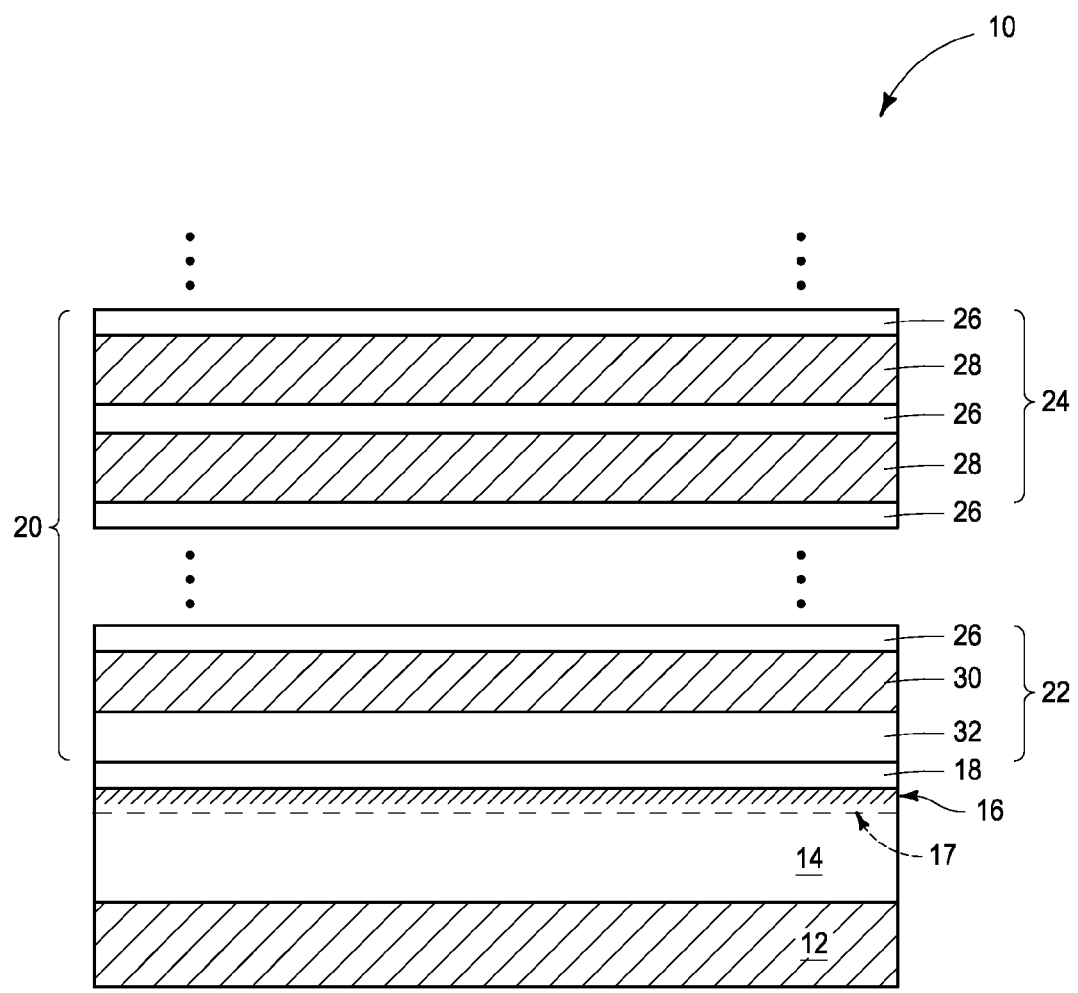

Referring to FIG. 4, a stack 20 is formed over the protective material 18. The stack includes a lower region 22 comprising materials utilized in forming a select gate (for instance, a source-side select gate (SGS)), and an upper region 24 utilized in forming vertically-stacked memory (for instance, memory cells of three-dimensional NAND). The region 22 is spaced from the region 24 by a gap to indicate that there may be other materials between the regions 22 and 24 besides those shown. Also, region 24 is diagrammatically indicated to continue upwardly beyond the illustrated portion.

The region 24 comprises alternating first and second levels 26 and 28. The levels 26 may be dielectric, and the levels 28 may be conductive. The conductive levels 28 may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the conductive levels 28 may comprise n-type doped polysilicon. The dielectric levels 26 may comprise any suitable composition or combination of compositions; and may, for example, comprise silicon dioxide.

The conductive levels 28 may be utilized to pattern control gates of flash devices. In such applications, a vertical string of memory cells (such as, for example, a vertical NAND string of memory cells) may be fabricated, with the number of memory cells in each string being determined by the number of conductive levels 28. The region 24 may comprise any suitable number of conductive levels. For instance, the region may have 8 conductive levels, 16 conductive levels, 32 conductive levels, 64 conductive levels, 512 conductive levels, 1024 conductive levels, etc.

The region 22 comprises a select gate material 30, which is over an insulative material 32.

In some embodiments, the select gate material 30 may be source-side select gate material (SGS material); and may comprise one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.).

The insulative material 32 may comprise any suitable composition or combination of compositions; and in some embodiments may comprise, consist essentially of, or consist of one or more of aluminum oxide, hafnium oxide, etc.

Figure 5:
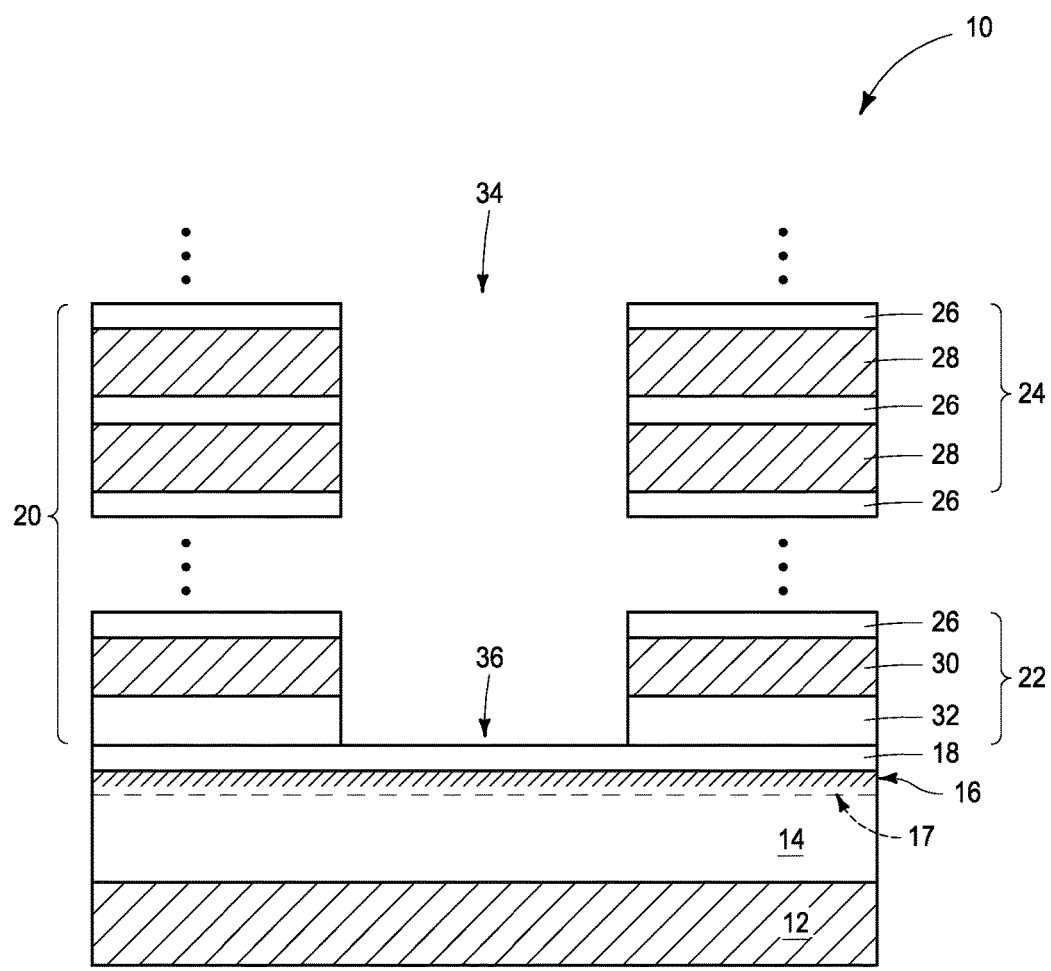

Referring to FIG. 5, an opening 34 is etched through the stack 20 to expose a region 36 of the protective material 18. The opening 34 may be formed with one etch or multiple etches. The opening may have any suitable shape when viewed from above; and may be, for example, circular, elliptical, polygonal, square, rectangular, etc.

Figure 6:
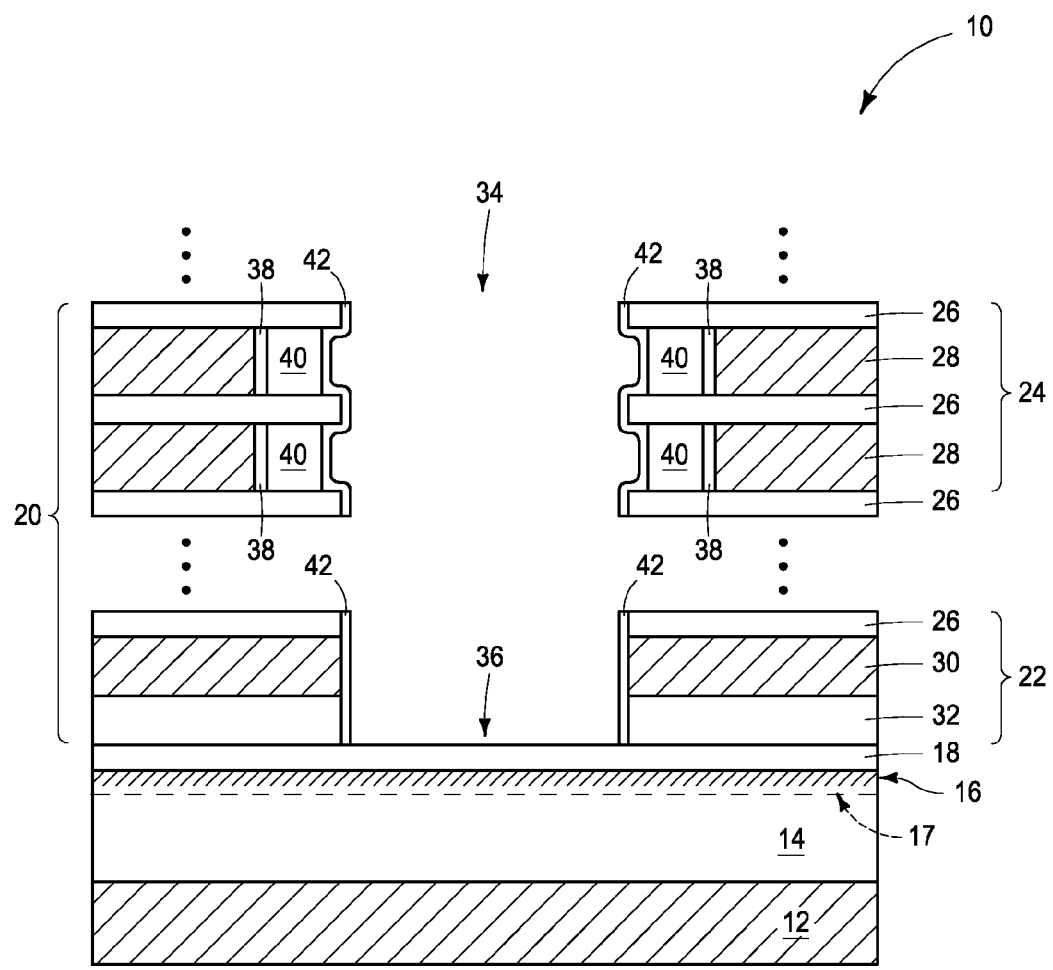

Referring to FIG. 6, the conductive levels 28 are recessed. Subsequently, charge-blocking material 38 and charge-storage material 40 are formed within the recesses.

The charge-blocking material 38 may comprise any suitable composition or combination of compositions; and in some embodiments may comprise one or more of silicon dioxide, hafnium oxide, zirconium oxide, silicon nitride, etc.

The charge-storage material 40 may comprise any suitable composition or combination of compositions; and in some embodiments may comprise floating gate material (for instance, doped or undoped silicon) or charge-trapping material (for instance, silicon nitride, metal dots, etc.).

Gate dielectric 42 is formed along sidewalls of opening 34. The gate dielectric 42 may comprise any suitable composition or combination of compositions; and in some embodiments may comprise, for example, silicon dioxide.

The gate dielectric is shown as a layer along the sidewalls of opening 34, as would occur if dielectric 42 were deposited. In other embodiments, the gate dielectric may be thermally grown along exposed surfaces of the materials 30 and 40, and accordingly may only extend along such exposed surfaces.

The embodiment of FIGS. 5 and 6 shows opening 34 formed to extend entirely through the select device region 22 and the memory region 24 of stack 20 prior to recessing conductive levels 28 of the memory region 24. In other embodiments, the opening 34 may be first formed through the memory region 24, then the conductive levels 28 may be recessed and the materials 38 and 40 provide within such recesses prior to extending the opening 34 through the select device region 22.

Figure 7:
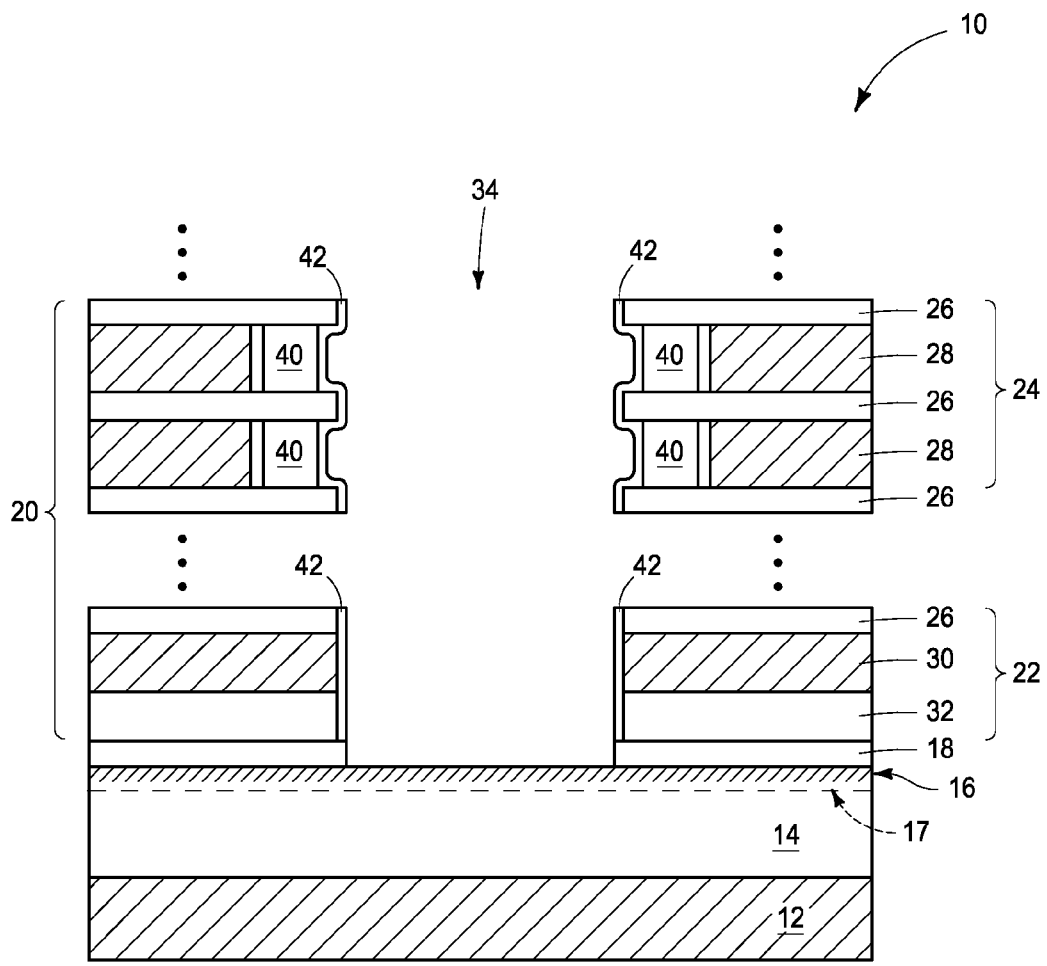

Referring to FIG. 7, the exposed region 36 (FIG. 6) of the protective material 18 is removed to expose an upper surface of the heavily-doped region 16. Such removal preferably occurs while the construction 10 is within a non-oxidizing ambient (for instance, under nitrogen, argon, etc.). Although the entirety of the exposed region of protective material 18 is removed in the illustrated embodiment, in other embodiments only some of the exposed region may be removed. The exposed region of the protective material may be removed with any suitable processing. In some embodiments semiconductor material (e.g., silicon, germanium, etc.) of protective material 18 is removed with an etch. In some embodiments, semiconductor material (e.g., silicon, germanium, etc.) of protective material 18 is at least partially oxidized and then removed with an etch.

Figure 8:
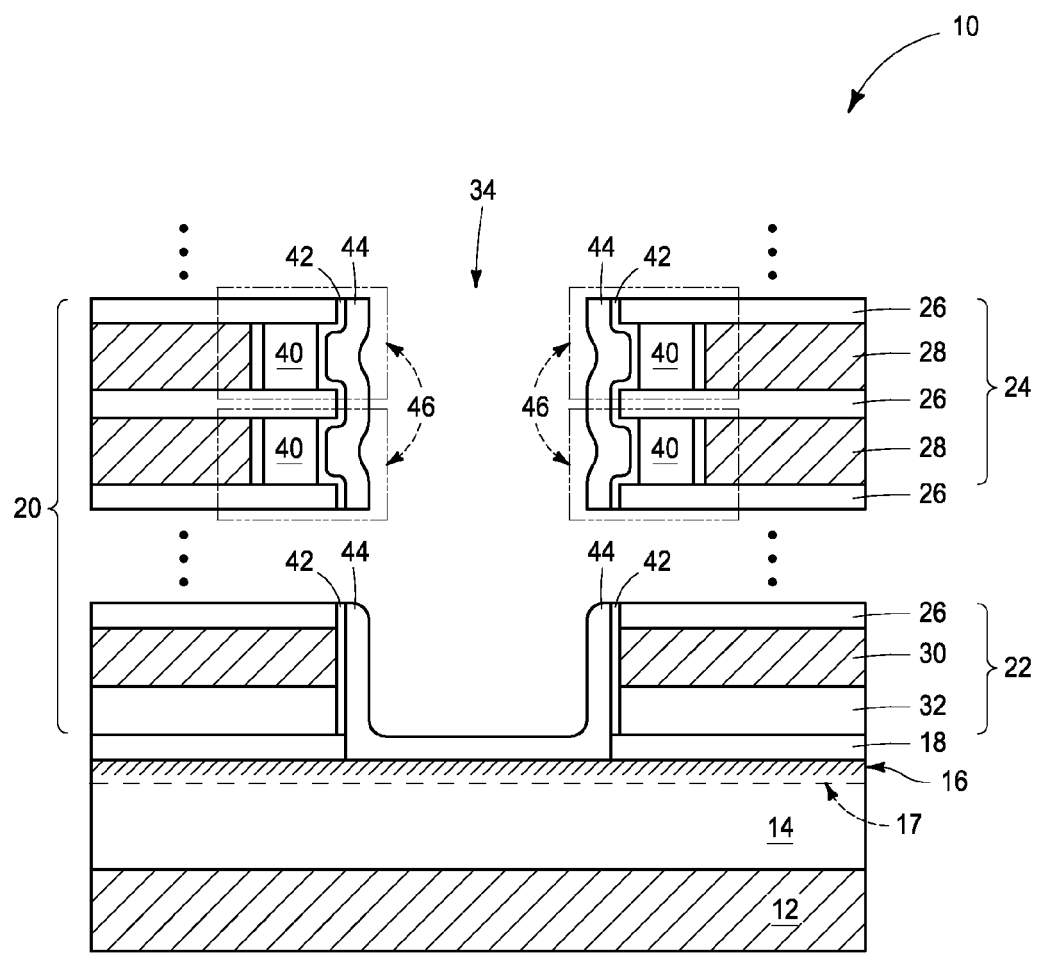

Referring to FIG. 8, channel material 44 is formed within opening 34. In the shown embodiment, the channel material lines sidewalls and a bottom of the opening to form a hollow configuration. In other embodiments, the channel material may entirely fill the opening to form a solid configuration.

The channel material comprises lightly-doped semiconductor material. In some embodiments the channel material may be referred to as a second semiconductor material to distinguish it from the first semiconductor material 14. The channel material may be doped to a concentration of less than or equal to about $10^{18}$ atoms/cm$^3$ in some embodiments. The channel material may be doped to a same majority dopant type as the semiconductor material 14.

In the illustrated embodiment, the same channel material 44 extends along the memory region 24 and select device region 22. In other embodiments, a different channel material may be formed within the memory region than is formed within the select device region.

The channel material 44 is formed over a non-oxidized surface of heavily-doped region 16. Such may be accomplished by not exposing the surface of the heavily-doped region to oxidant (e.g., oxygen) from the time of removal of the region 36 of protective material 18 (FIG. 6) until the time of forming the channel material 44 within opening 34.

The channel material 44, gate dielectric 42, charge-storage material 40, charge-blocking material 38 and conductive levels 28 together form a plurality of vertically-stacked memory cells 46. Such memory cells may be comprised by a three-dimensional NAND memory array in some embodiments.

Figure 9:
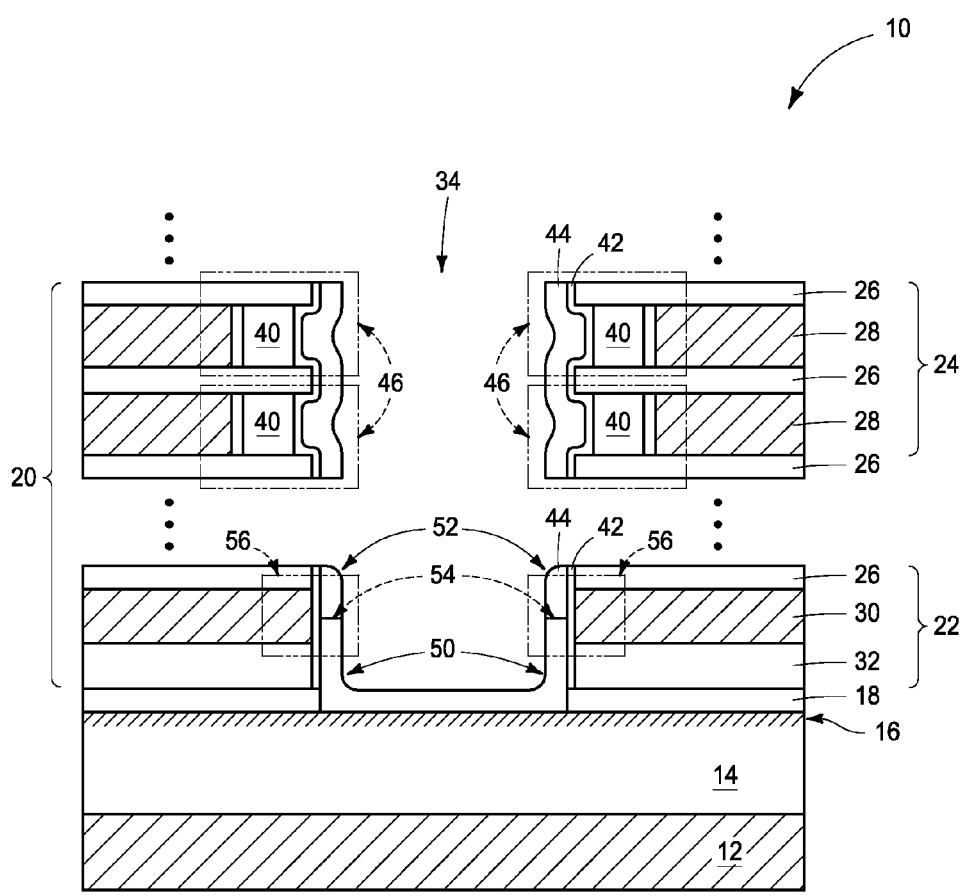

Referring to FIG. 9, dopant is out-diffused from heavily-doped region 16 into the channel material 44 to form a heavily-doped lower region 50 within the channel material. Such out-diffusion may be accomplished utilizing, for example, thermal processing. Dopant may also diffuse downwardly into material 14, and accordingly the diagrammatic lower boundary 17 (FIG. 8) of the doped region is removed at the processing stage of FIG. 9.

An upper region 52 of the channel material within the select device region 22 remains lightly doped. The lightly-doped upper region and heavily-doped lower region joined one another along a boundary region 54. The heavily-doped lower region and lightly-doped upper region may be majority doped to a same dopant type as one another (i.e. may both be p-type majority doped or may both be n-type majority doped), and accordingly the boundary region 54 may correspond to an n+/n junction, n+/n− junction, p+/p junction, p+/p− junction, etc.

The junction 54, together with dielectric 42 and conductive material 30 form a select gate device 56. The select gate device 56 is connected in series to the vertically-stacked memory cells 46 through the channel material 44. The illustrated memory cells 46 are an example configuration, and other memory cells may be utilized in other embodiments.

Figure 10:
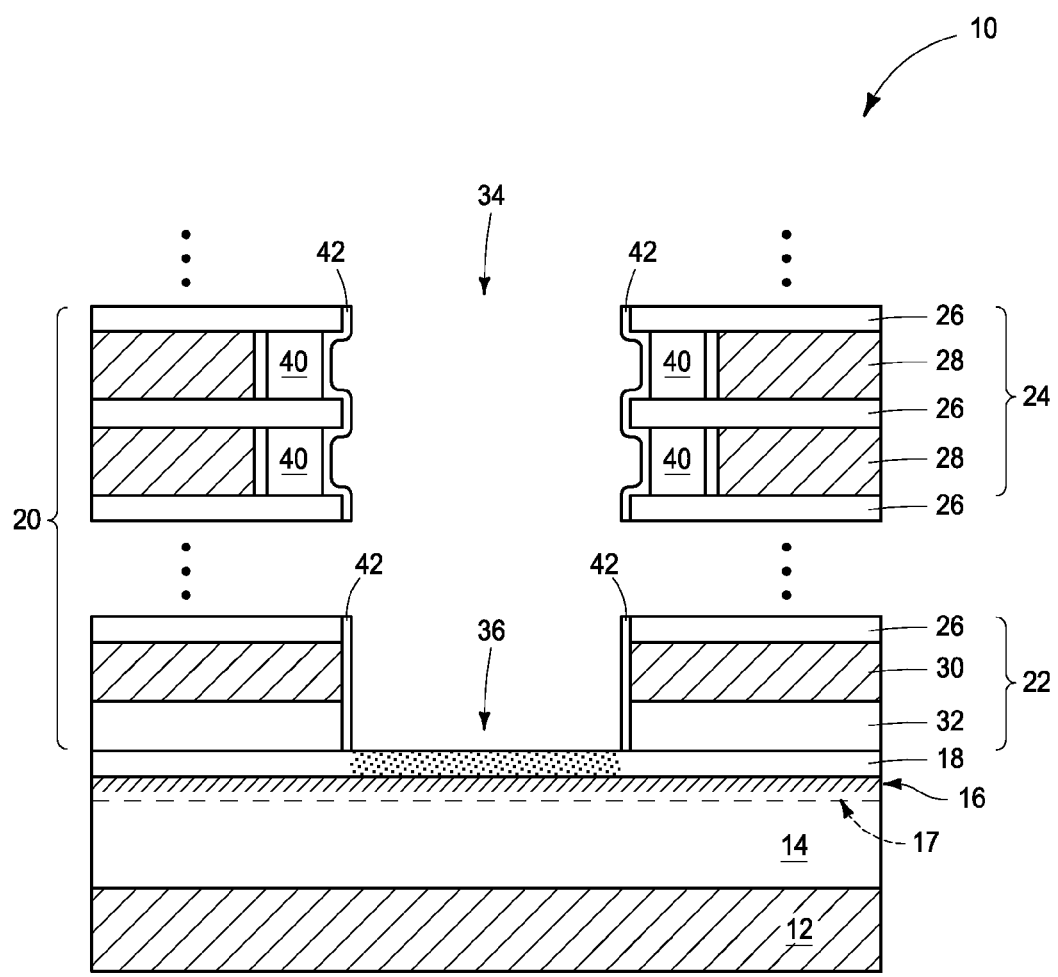
FIGS. 10-12 are diagrammatic cross-sectional views of a construction at various process stages of another example method for forming another example embodiment integrated assembly. The process stage of FIG. 10 may follow that of FIG. 4.

The processing of FIGS. 7-9 comprises removal of an entirety of the exposed region 36 (FIG. 6) of protective material 18 from a bottom of opening 34. In other embodiments, some or all of such exposed region may remain in a final configuration. For instance, FIG. 10 shows a processing stage analogous to that of FIG. 6, but in which the region 36 of material 18 remains at the bottom of opening 34. Stippling is provided within region 36 indicate that such region may be optionally modified at the processing stage of FIG. 10 relative to other portions of material 18. For instance, region 36 may be at least partially oxidized during the processing utilized to form opening 34 and/or during processing utilized to form gate dielectric 42.

It may be advantageous that material 18 comprise, consist essentially of, or consist of germanium at the processing of FIG. 10. Specifically, it is found that germanium oxide is sufficiently permeable to dopant that the germanium oxide may remain between two semiconductor materials as dopant is out-diffused from one of the semiconductor materials into the other. Thus, if a germanium-containing region 36 is partially or entirely oxidized, such region may remain without adversely impacting a subsequent out-diffusion (discussed below with reference to FIG. 12). In contrast, silicon dioxide blocks diffusion of dopant. Accordingly if region 36 consists of silicon dioxide during an attempt at subsequent out-diffusion of the type discussed below with reference to FIG. 12, the silicon dioxide may block diffusion of dopant and thereby preclude the desired out-diffusion.

If region 36 does not become at least partially oxidized, then the region may remain as any suitable semiconductor material (e.g., silicon, germanium, silicon/germanium, etc.) without adversely impacting a subsequent out-diffusion.

Figure 11:
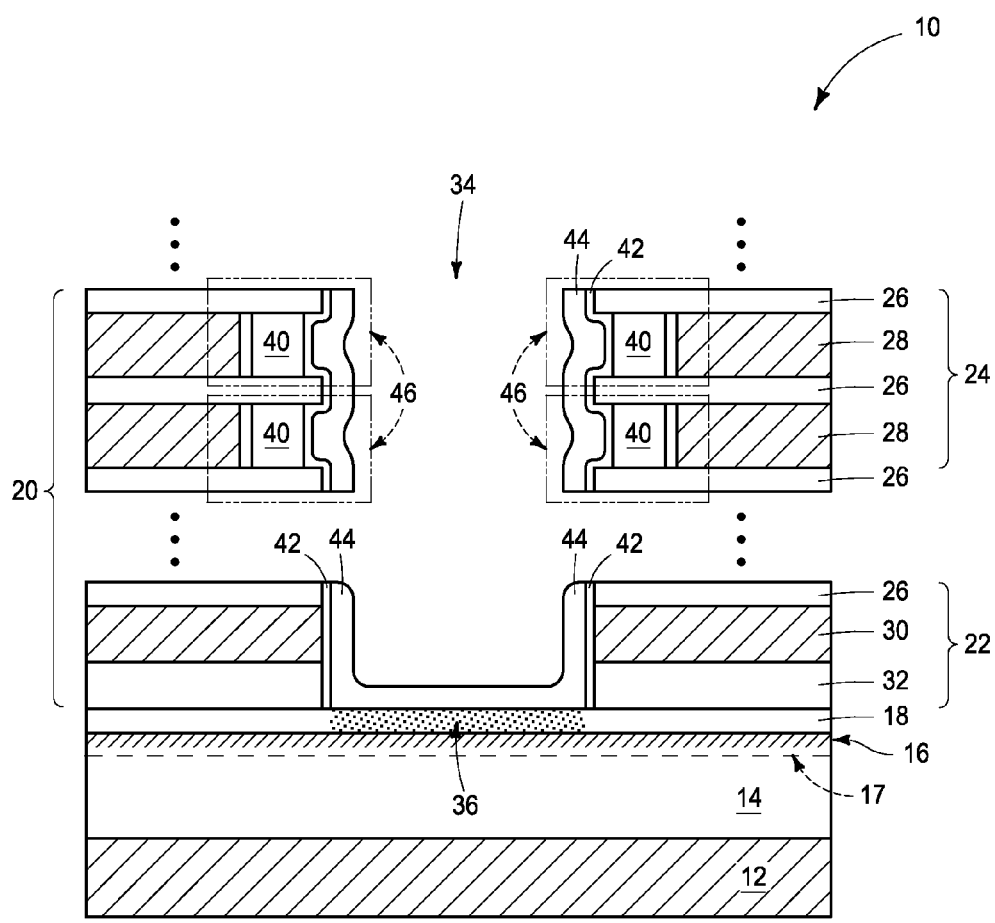

Referring to FIG. 11, channel material 44 is formed within opening 34 with processing analogous to that described above with reference to FIG. 8.

Figure 12:
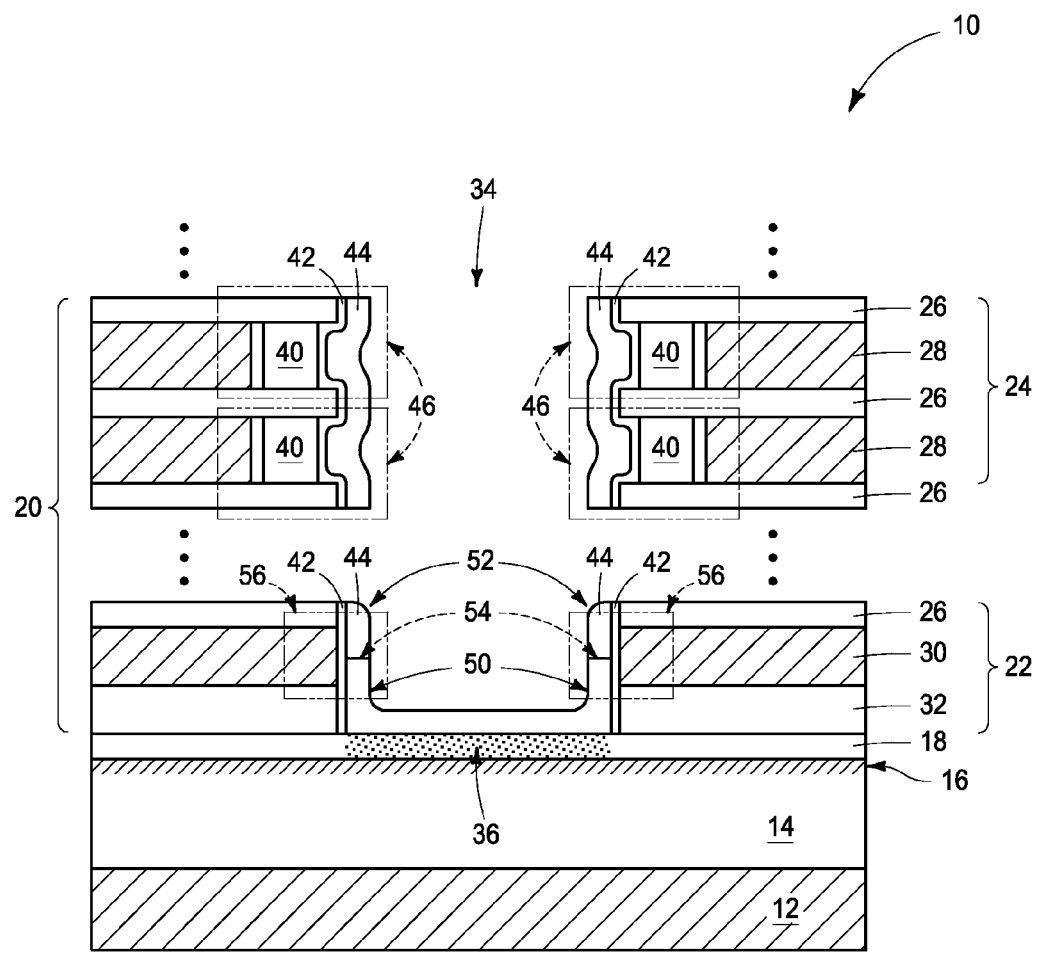

Referring to FIG. 12, dopant is out-diffused from heavily-doped region 16 into the channel material 44 to form the heavily-doped lower region 50 within the channel material. Dopant may also diffuse downwardly into material 14, and accordingly the diagrammatic lower boundary 17 (FIG. 11) of the doped region is removed at the processing stage of FIG. 12.

The upper region 52 of the channel material within the select device region 22 remains lightly doped. The lightly-doped upper region and heavily-doped lower region joined one another along the boundary region 54. The heavily-doped lower region and lightly-doped upper region may be majority doped to a same dopant type as one another (i.e.

may both be p-type majority doped or may both be n-type majority doped), and accordingly the boundary region 54 may correspond to an n+/n junction, n+/n− junction, p+/p junction, p+/p− junction, etc.

The junction 54, together with dielectric 42 and conductive material 30 form the select gate device 56. The select gate device 56 is connected in series to the vertically-stacked memory cells 46 through the channel material 44. The illustrated memory cells 46 are an example configuration, and other memory cells may be utilized in other embodiments.

In some embodiments, the configuration of FIG. 12 may comprise a first semiconductor structure 14 comprising an upper region 16 of heavily-doped silicon. The configuration may further include a germanium-containing interface material (for instance, germanium-containing material 18) over the first semiconductor structure 14. The term "germanium-containing interface material" may specifically refer to the region 36 in some embodiments. Such germanium-containing interface material may be entirely non-oxidized in some embodiments. In other embodiments it may be at least partially oxidized. Accordingly, in some embodiments the germanium-containing interface material may comprise, consist essentially of, or consist of germanium oxide.

The configuration of FIG. 12 comprises a second semiconductor structure 44 over the germanium-containing interface material. The second semiconductor structure has a heavily-doped lower region (or first region) 50, a lightly-doped upper region (or second region) 52, and a boundary region 54 where the heavily-doped region and lightly-doped region join.

The first and second semiconductor structures 14 and 44 of FIG. 12 may comprise any suitable materials, and in some embodiments may both be silicon-containing structures.

The lightly-doped region 52 and heavily-doped region 50 may comprise a same majority dopant type as one another; and accordingly may both be p-type or both be n-type.

The select device 56 of FIG. 12 is a transistor which comprises a gating structure adjacent boundary region 54, with such a gating structure being comprised by conductive material 30. The gating structure of FIG. 12 is an example gating structure, and other gating structures may be utilized in other embodiments.

The memory cells 46 are vertically-stacked over the select device 56, and in some embodiments may be comprised by a NAND memory array.

The structures and assemblies discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an integrated assembly having a first semiconductor structure comprising heavily-doped silicon, a germanium-containing interface material over the first semiconductor structure, and a second semiconductor structure over the germanium-containing interface material. The second semiconductor structure has a heavily-doped lower region adjacent the germanium-containing interface material and has a lightly-doped upper region above the heavily-doped lower region. The lightly-doped upper region and heavily-doped lower region are majority doped to a same dopant type, and join to one another along a boundary region.

Some embodiments include an integrated assembly comprising germanium oxide between a first silicon-containing structure and a second silicon-containing structure.

Some embodiments include a method of forming an assembly. A heavily-doped region is formed along a surface of a first semiconductor material. A protective material is formed over the heavily-doped region. A stack is formed over the protective material. An etch through the stack to the protective material forms an opening which exposes a region of the protective material. Protective material is removed to expose the heavily-doped region. Lightly-doped second semiconductor material is formed within the opening. The heavily-doped region is not being exposed to oxidant from the time of removing the protective material to the time of forming the lightly-doped second semiconductor material. Dopant is out-diffused from the heavily-doped region and into the second semiconductor material. The out-diffusing of dopant forms a heavily-doped lower region within the second semiconductor material adjacent the heavily-doped region and leaves a lightly-doped upper region of the second semiconductor material above the heavily-doped lower region. The lightly-doped upper region and heavily-doped lower region are majority doped to a same dopant type, and join to one another along a boundary region.

Some embodiments include a method of forming an assembly. A heavily-doped region is formed along a surface of a first semiconductor material. A protective material is formed over the heavily-doped region. A stack is formed over the protective material. An etch through the stack to the protective material forms an opening which exposes a region of the protective material. Protective material within the exposed region is oxidized to form an oxide. Lightly-doped second semiconductor material is formed within the opening. Dopant is out-diffused from the heavily-doped region, through the oxide and into the second semiconductor material. The out-diffusing forms a heavily-doped lower region within the second semiconductor material adjacent the oxide while leaving a lightly-doped upper region of the second semiconductor material above the heavily-doped lower region. The lightly-doped upper region and heavily-doped lower region are majority doped to a same dopant type, and join to one another along a boundary region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated circuit assembly, comprising:
   a first semiconductor structure comprising heavily-doped silicon;
   a germanium-containing interface material over the first semiconductor structure, the germanium-containing interface material consisting of a material selected from non-oxidized germanium and partially oxidized germanium;
   a protective material comprising one or both of Si and Ge over the germanium-containing interface material;
   an opening extending entirely through the protective material; and
   a second semiconductor structure extending within the opening and contacting the germanium-containing interface material; the second semiconductor structure having a heavily-doped lower region adjacent the germanium-containing interface material and having a lightly-doped upper region above the heavily-doped lower region; the lightly-doped upper region and heavily-doped lower region being majority doped to a same dopant type, and joining to one another along a boundary region.

2. The integrated assembly of claim 1 wherein said same dopant type is n-type.

3. The integrated assembly of claim 1 wherein said same dopant type is p-type.

4. The integrated assembly of claim 1 wherein the germanium-containing interface material comprises germanium oxide.

5. The integrated assembly of claim 1 wherein the germanium-containing interface material comprises non-oxidized germanium.

6. The integrated assembly of claim 1 comprising a gating structure adjacent the boundary region.

7. The integrated assembly of claim 6 wherein the gating structure is comprised by a select device, with the select device being a source side select gate (SGS) device; and further comprising a plurality of memory cells connected in series with the select device.

8. The integrated assembly of claim 7 wherein the memory cells are vertically stacked over the select device.

9. The integrated assembly of claim 8 wherein the vertically-stacked memory cells are part of a NAND memory array.

10. An integrated circuit assembly comprising less than fully oxidized semiconductor material between a first conductively dope silicon structure and a second conductively doped silicon structure, the semiconductor of the less than fully oxidized semiconductor material consisting of germanium, wherein:
    the first conductively doped silicon structure is heavily-doped; and
    the second conductively doped silicon structure has a heavily-doped first region adjacent the less than fully oxidized semiconductor material and has a lightly-doped second region adjacent the heavily-doped first region; the lightly-doped second region and heavily-doped first region being majority doped to a same dopant type, and joining to one another along a boundary region.

11. The integrated assembly of claim 10 comprising a gating structure adjacent the boundary region.

12. The integrated assembly of claim 11 wherein the gating structure is comprised by a select device, with the select device being a source side select gate (SGS) device; and further comprising a plurality of memory cells connected in series with the select device.

13. The integrated assembly of claim 12 wherein the memory cells are vertically stacked over the select device.

14. The integrated assembly of claim 13 wherein the vertically stacked memory cells are part of a NAND memory array.

* * * * *